United States Patent
Yoon et al.

(10) Patent No.: US 10,698,034 B2
(45) Date of Patent: Jun. 30, 2020

(54) OVERVOLTAGE PROTECTION CIRCUIT, CONTROL METHOD THEREFOR AND BATTERY PACK

(71) Applicant: LG CHEM, LTD., Seoul (KR)

(72) Inventors: Ho Byung Yoon, Daejeon (KR); Sang Hoon Lee, Daejeon (KR); Jaedong Park, Daejeon (KR); Chang Hyun Sung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 587 days.

(21) Appl. No.: 15/520,506

(22) PCT Filed: Dec. 28, 2015

(86) PCT No.: PCT/KR2015/014356
§ 371 (c)(1),
(2) Date: Apr. 20, 2017

(87) PCT Pub. No.: WO2016/114513
PCT Pub. Date: Jul. 21, 2016

(65) Prior Publication Data
US 2017/0315177 A1    Nov. 2, 2017

(30) Foreign Application Priority Data

Jan. 12, 2015 (KR) .................. 10-2015-0004435
Oct. 29, 2015 (KR) .................. 10-2015-0151388

(51) Int. Cl.
*G01R 31/36* (2020.01)
*G01R 31/3835* (2019.01)
(Continued)

(52) U.S. Cl.
CPC ...... *G01R 31/3835* (2019.01); *H01M 10/441* (2013.01); *H01M 10/46* (2013.01);
(Continued)

(58) Field of Classification Search
CPC .................................................. H02J 7/0029
(Continued)

(56) References Cited

U.S. PATENT DOCUMENTS

2014/0063666 A1    3/2014    Kallal et al.

FOREIGN PATENT DOCUMENTS

JP    2005-192281 A    7/2005
JP    2013-135479 A    7/2013
(Continued)

OTHER PUBLICATIONS

International Search Report issued in PCT/KR2015/014356 (PCT/ISA/210), dated Mar. 31, 2016.
(Continued)

*Primary Examiner* — Edward Tso
*Assistant Examiner* — Ahmed H Omar
(74) *Attorney, Agent, or Firm* — Birch, Stewart, Kolasch & Birch, LLP

(57) ABSTRACT

The overvoltage protection circuit according to an embodiment of the present invention includes: a voltage measurement unit for measuring the voltage of a battery; a power control unit that supplies power if the battery voltage value measured in the voltage measurement unit is equal to or greater than a first predetermined voltage value; and a cut-off circuit unit that receives power supplied from the power control unit and cuts off the charge of the battery if the voltage value of the battery is equal to or greater than a second predetermined voltage value that is higher than the first voltage value.

20 Claims, 4 Drawing Sheets

(51) Int. Cl.
*H01M 10/44* (2006.01)
*H01M 10/46* (2006.01)
*H01M 10/48* (2006.01)
*H02J 7/00* (2006.01)
*H01M 2/34* (2006.01)
*G01R 19/165* (2006.01)
*H01M 10/42* (2006.01)

(52) U.S. Cl.
CPC ......... *H01M 10/482* (2013.01); *H02J 7/0029* (2013.01); *G01R 19/16542* (2013.01); *H01M 2/34* (2013.01); *H01M 2010/4271* (2013.01); *H02J 7/0031* (2013.01)

(58) Field of Classification Search
USPC .................................................. 320/134, 136
See application file for complete search history.

(56) References Cited

FOREIGN PATENT DOCUMENTS

| | | | |
|---|---|---|---|
| KR | 10-2007-0009252 A | 1/2007 | |
| KR | 10-2011-0078049 A | 7/2011 | |
| KR | 10-1457986 B1 * | 11/2014 | ............... H02J 7/00 |
| KR | 10-1457986 B1 | 11/2014 | |
| WO | WO 2013/065329 A1 | 5/2013 | |

OTHER PUBLICATIONS

European Search Report for Appl. No. 15878157.5 dated Jun. 29, 2018.

\* cited by examiner

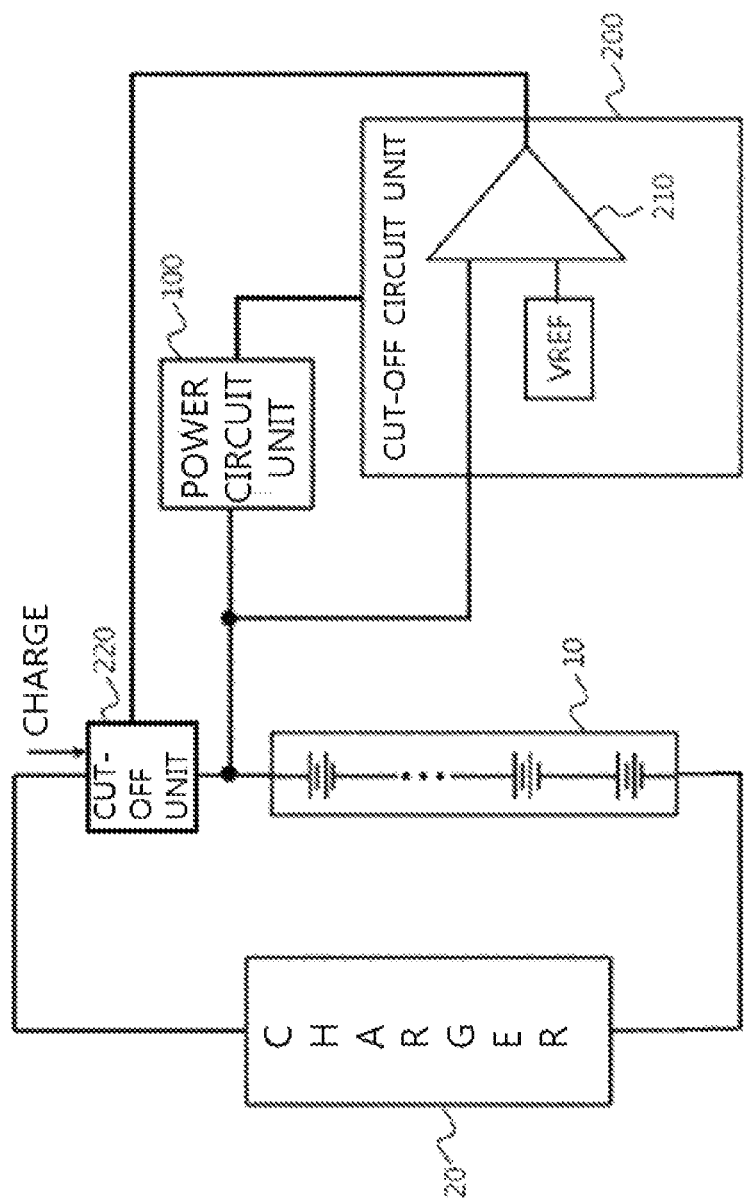
[Figure 1]

[Figure 2]
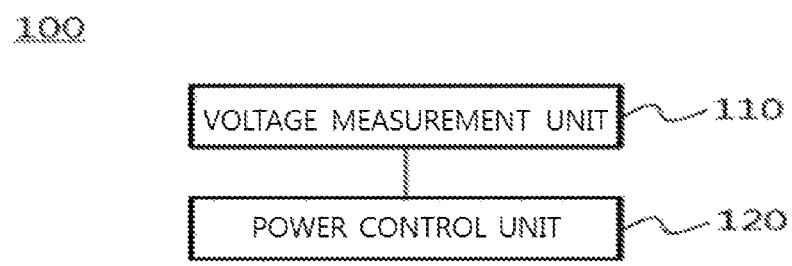

[Figure 3]
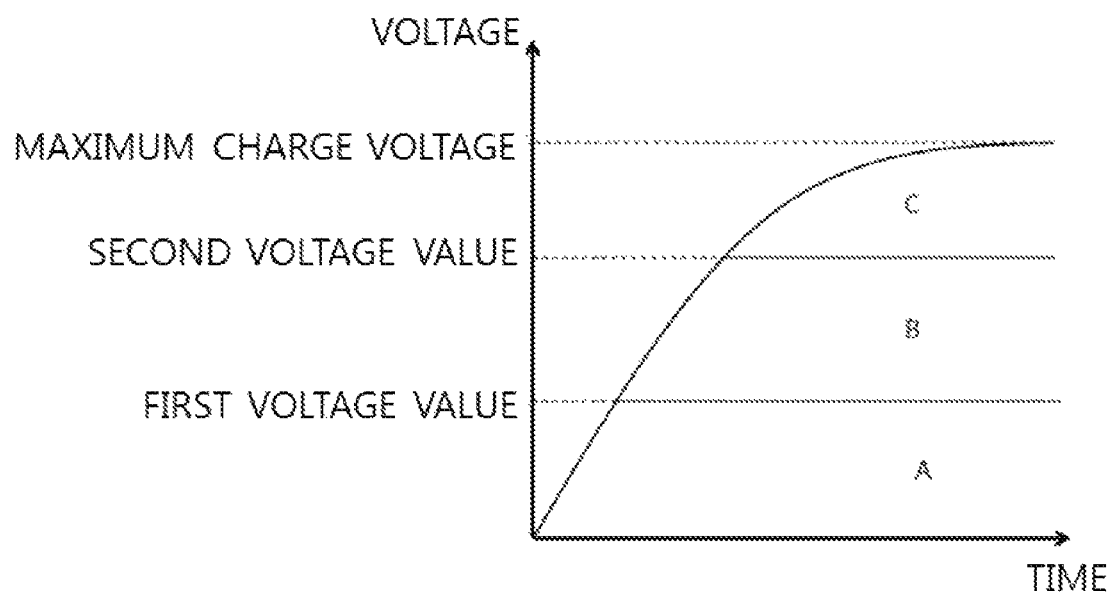

[Figure 4]
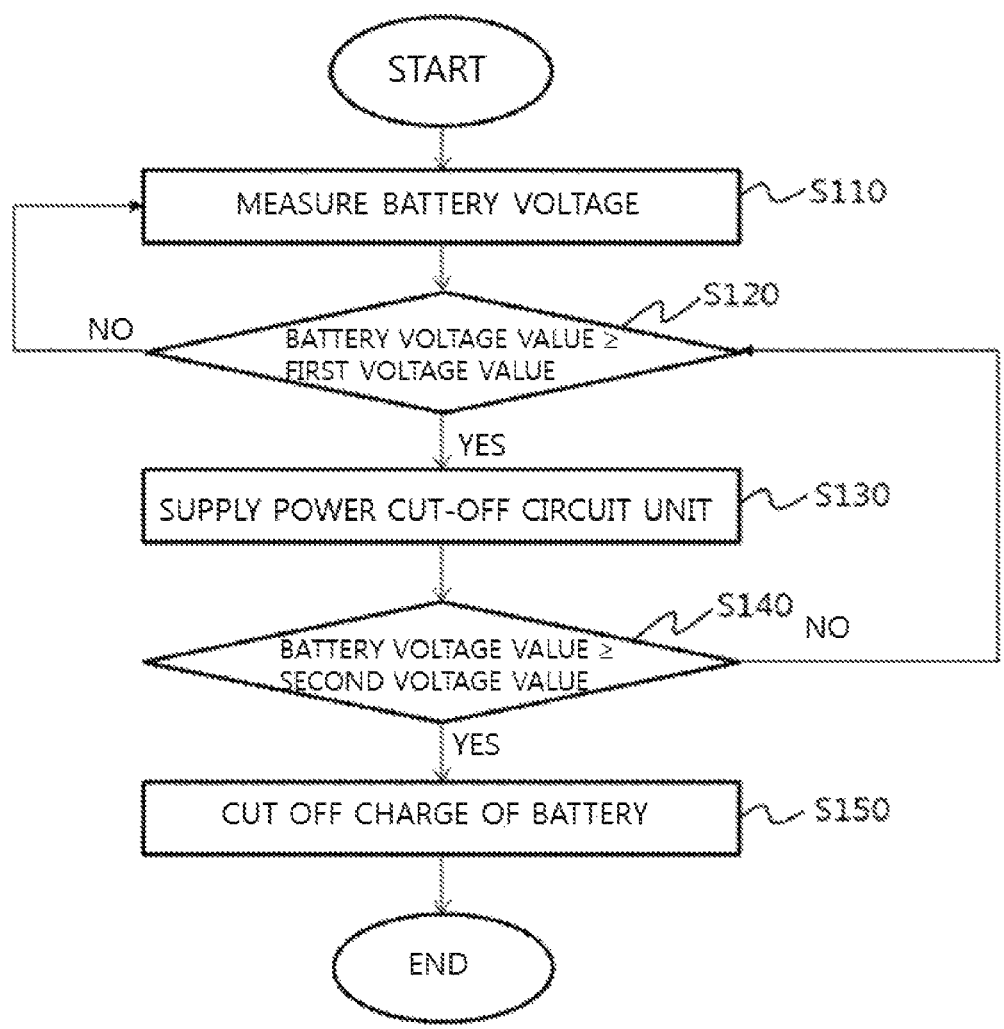

OVERVOLTAGE PROTECTION CIRCUIT, CONTROL METHOD THEREFOR AND BATTERY PACK

TECHNICAL FIELD

This application claims priority to and the benefit of Korean Patent Application No. 10-2015-0004435 filed in the Korean Intellectual Property Office on Jan. 12, 2015 and Korean Patent Application No. 10-2015-0151388 filed in the Korean Intellectual Property Office on Oct. 29, 2015, the entire contents of which are incorporated herein by reference.

The present invention relates to an overvoltage protection circuit, a control method therefore, and a battery pack, and more particularly, to an overvoltage protection circuit, a control method therefor and a battery pack that can reduce normal power consumption.

BACKGROUND ART

A secondary battery having electric characteristics, such as high ease of applicability according to a product group and high energy density, has been commonly applied to electric vehicles (EV), hybrid electric vehicles (HEV), energy storage systems, or the like which are driven by an electric driving source, as well as portable devices. The secondary battery has received public attention as a new energy source for promoting eco-friendly performance and energy efficiency in that byproducts are not generated at all according to the use of the energy as well as a primary advantage of dramatically reducing the use of fossil fuels.

The secondary battery is repeatedly chargeable and dischargeable by an electrochemical reaction between constituent elements including positive and negative current collectors, a separator, an active material, an electrolyte, and the like. A lithium polymer secondary battery which is widely used as an example has an operation voltage of about 3.7 V to 4.2 V. Accordingly, the battery pack is configured by connecting a plurality of unit secondary battery cells in series in order to obtain a high-output battery pack which is applied to the electric vehicles and the like.

In addition to the basic structure, the battery pack may be configured to additionally include an overvoltage protection circuit that cuts off the charge when an overvoltage situation occurs by measuring the voltage of the battery pack in order to prevent the overvoltage charge during charging. However, in order to cut off the charge, since the voltage of the battery pack needs to be continuously sensed, the cut-off circuit has no choice but to operate normally, and accordingly, power consumption cannot help being large. Further, even in a situation where the battery pack is not used, since the cut-off circuit operates, there is a problem in that the battery pack discharges quickly.

DETAILED DESCRIPTION OF THE INVENTION

Technical Problem

An object of the present invention is to provide an overvoltage protection circuit that can reduce self-power consumption.

Further, another object of the present invention is to reduce normal power consumption of the entire battery pack by reducing the power consumption of the overvoltage protection circuit.

Technical Solution

The present invention has the following configurations.

(1) An overvoltage protection circuit including: a voltage measurement unit for measuring the voltage of a battery; a power control unit that supplies power if the battery voltage value measured in the voltage measurement unit is equal to or greater than a first predetermined voltage value; and a cut-off circuit unit that receives power supplied from the power control unit and cuts off the charge of the battery if the voltage value of the battery is equal to or greater than a second predetermined voltage value.

(2) The second voltage value may be equal to or greater than the first voltage value in the overvoltage protection circuit disclosed in section (1).

(3) The voltage measurement unit and the power control unit may be configured by an integral power circuit unit in the overvoltage protection circuit disclosed in section (1).

(4) The power circuit unit may be connected between the battery and the cut-off circuit unit in the overvoltage protection circuit disclosed in section (1).

(5) The cut-off circuit unit may be configured to include a voltage comparator that judges whether the battery voltage value is equal to or greater than the second voltage value.

(6) The cut-off circuit unit may not operate if the battery voltage value is less than the first voltage value in the overvoltage protection circuit disclosed in any one section of sections (1) to (5).

(7) The cut-off circuit unit may operate when the battery is charged in the overvoltage protection circuit disclosed in any one section of sections (1) to (5).

(8) A battery pack including: a battery; a voltage measurement unit that measures the voltage of the battery; a power control unit that supplies power if the battery voltage value measured in the voltage measurement unit is equal to or greater than a first predetermined voltage value; and a cut-off circuit unit that receives power supplied from the power control unit and cuts off the charge of the battery if the voltage value of the battery is equal to or greater than a second predetermined voltage value.

(9) The second voltage value may be equal to or greater than the first voltage value in the battery pack disclosed in section (8).

(10) The voltage measurement unit and the power control unit may be configured by an integral power circuit unit in the battery pack disclosed in section (9).

(11) The power circuit unit may be connected between the battery and the cut-off circuit unit in the battery pack disclosed in section (10).

(12) The cut-off circuit unit may be configured to include a voltage comparator that judges whether the battery voltage value is equal to or greater than the second voltage value in the battery pack disclosed in section (8).

(13) The cut-off circuit unit may not operate if the battery voltage value is less than the first voltage value in the battery pack disclosed in any one section of sections (8) to (12).

(14) The cut-off circuit unit may operate when the battery is charged in any one section of sections (8) to (12).

(15) A control method of an overvoltage protection circuit including measuring a voltage of a battery; judging whether the battery voltage value measured in the measuring is equal to or greater than a first predetermined voltage value; supplying power to a cut-off circuit unit when the battery voltage value is equal to or greater than the first voltage value; judging whether the battery voltage value is equal to or greater than a second predetermined voltage value; and cutting off the charge of the battery by the cut-off circuit unit if the battery voltage value is equal to or greater than the second voltage value.

(16) The second voltage value may be equal to or greater than the first voltage value in the control method of an overvoltage protection circuit disclosed in section (15).

(17) The measuring and the judging of whether the battery voltage value is equal to or greater than the first voltage value may be performed by a power circuit unit which is integrally formed in the control method of an overvoltage protection circuit disclosed in section (15).

(18) The power circuit unit may be connected between the battery and the cut-off circuit unit and perform the measuring and the judging of whether the battery voltage value is equal to or greater than the first voltage value in the control method of an overvoltage protection circuit disclosed in section (17).

(19) In the judging of whether the battery voltage value is equal to or greater than the second voltage value, the judging of whether the battery voltage value is equal to or greater than the second voltage value may be performed by a voltage comparator in the control method of an overvoltage protection circuit disclosed in section (18).

(20) The judging of whether the battery voltage value is equal to or greater than the second voltage value and the cutting-off may not be performed if the battery voltage value is less than the first voltage value in the control method of an overvoltage protection circuit disclosed in any one section of sections (15) to (19).

(21) The judging of whether the battery voltage value is equal to or greater than the second voltage value and the cutting-off may be performed when the battery is charged in the control method of an overvoltage protection circuit disclosed in any one section of sections (15) to (19).

Advantageous Effects

According to the embodiment of the present invention, when the voltage of the battery is not greater than the predetermined voltage, the power circuit unit does not supply the power to the cut-off circuit unit. As a result, the present invention can reduce power consumption because only the power circuit unit operates when the battery pack is not used.

Further, the voltage measurement unit and the power control unit may be integrally configured, thereby reducing a volume and a space which are occupied by the voltage measurement unit and the power control unit.

In addition, the present invention can reduce power consumption by sensing the voltage of the battery only in the power circuit unit when the voltage of the battery is less than the predetermined voltage and more precisely sensing the voltage of the battery through the cut-off circuit unit when the voltage of the battery is equal to or greater than the predetermined voltage.

BRIEF DESCRIPTION OF DRAWINGS

FIG. 1 is a circuit diagram of an overvoltage protection circuit according to an embodiment of the present invention.

FIG. 2 is a block diagram illustrating a configuration of a power circuit unit of the overvoltage protection circuit according to the embodiment of the present invention.

FIG. 3 is a diagram for describing operations of a power circuit unit and a cut-off circuit unit according to a battery voltage value in a charge graph of a battery.

FIG. 4 is a flowchart for describing a control method of the overvoltage protection circuit according to the embodiment of the present invention.

BEST MODE

The present invention will be described below in detail with reference to the accompanying drawings. Herein, the repeated description and the detailed description of known function and configuration that may make the gist of the present invention unnecessarily ambiguous will be omitted. Embodiments of the present invention will be provided for more completely describing the present invention to those skilled in the art. Accordingly, shapes, sizes, and the like of elements in the drawings may be exaggerated for clearer explanation.

Hereinafter, structures and operations of an overvoltage protection circuit and a battery pack according to the embodiment of the present invention will be described.

FIG. 1 is a circuit diagram of an overvoltage protection circuit according to an embodiment of the present invention. FIG. 2 is a block diagram illustrating a configuration of a power circuit unit of the overvoltage protection circuit according to the embodiment of the present invention. FIG. 3 is a diagram for describing operations of a power circuit unit and a cut-off circuit unit according to a battery voltage value in a charge graph of a battery.

In FIGS. 1 to 3, an overvoltage protection circuit according to an embodiment of the present invention will be described, but the embodiment of the present invention may be implemented in a form of a battery pack including a battery and an overvoltage protection circuit.

Referring to FIG. 1, the overvoltage protection circuit according to the embodiment of the present invention is configured to include a power circuit unit 100 and a cut-off circuit unit 200. The overvoltage protection circuit illustrated in FIG. 1 follows an embodiment, and constituent elements thereof are illustrated to the embodiment illustrated in FIG. 1 and if necessary, some constituent elements may be added, modified, or deleted.

Referring to FIG. 2 together, the power circuit unit 100 is configured to include a voltage measurement unit 110 and a power control unit 120.

The voltage measurement unit 110 measures the voltage of a battery 10. In this case, the battery 10 may be configured by at least one battery cell.

The power control unit 120 judges whether the battery voltage value measured in the voltage measurement unit 110 is equal to or greater than a first predetermined voltage value. In addition, the power control unit 120 supplies power to the cut-off circuit unit 200 to be described below if the battery voltage value is equal to or greater than the first voltage value.

The voltage measurement unit 110 and the power control unit 120 may be integrally configured. For example, as illustrated in FIG. 1, the voltage measurement unit 110 and the power control unit 120 may be configured by the integral power circuit unit 100. Further, the power circuit unit 100 may be connected between the battery 10 and the cut-off circuit unit 200. As such, in the embodiment of the present invention, the voltage measurement unit 110 and the power control unit 120 may be integrally configured, thereby reducing a volume and a space which are occupied by the voltage measurement unit 110 and the power control unit 120. To this end, the voltage measurement unit 110 and the power control unit 120 may share a common component or unit.

The cut-off circuit unit 200 receives the power from the power control unit 120 and judges whether the battery voltage value is equal to or greater than a second predetermined voltage value. Herein, the second voltage value may be a value which is equal to or greater than the first voltage value. In addition, the cut-off circuit unit 200 cuts off the charge for the battery 10 when the battery voltage value is equal to or greater than the second voltage value. The cut-off circuit unit 200 does not operate when the battery voltage value is less than the first voltage value. Further, the cut-off circuit unit 200 operates at the time of charging the battery 10.

The cut-off circuit unit 200 may be configured to include a voltage comparator 210 and a cut-off unit 220. The voltage comparator 210 more precisely judges whether the battery voltage value is equal to or greater than the second voltage value. In addition, the cut-off unit 220 cuts off between the battery 10 and a charger 20 when the battery voltage value is equal to or greater than the second voltage value. The cut-off unit 220 may be configured by a power disconnect device (PDD).

Referring to FIG. 3 together, in a charge graph of the battery, when the charge of the battery starts, the battery passes the second voltage value through the first voltage value over time and reaches a maximum charge voltage. In the embodiment, when the battery reaches the maximum charge voltage, the maximum charge voltage has a bad effect on a lifespan of the battery such as overheating of the battery, and thus the second voltage value for cutting-off the battery may be formed approximately 70% to 90% of the maximum charge voltage of the battery according to a characteristic of the battery. When the charge of the battery starts, in a first region A where the battery voltage value is less than the first voltage value, only the power circuit unit 100 operates and the cut-off circuit unit 200 does not operate. In addition, in a second region B where the battery voltage value is equal to or greater than the first voltage value and less than the second voltage value, the power circuit unit 100 supplies the power to the cut-off circuit unit 200 and the cut-off circuit unit 200 precisely measures the voltage of the battery 10. Further, when reaching a third region C where the battery voltage value is equal to or greater than the second voltage value, the cut-off circuit unit 200 cuts off the charge for the battery 10.

As such, according to the embodiment of the present invention, when the voltage of the battery is not greater than the predetermined voltage, the power circuit unit does not supply the power to the cut-off circuit unit. As a result, the present invention can reduce power consumption because only the power circuit unit operates when the battery pack is not used.

In addition, the present invention can reduce power consumption by sensing the voltage of the battery only in the power circuit unit when the voltage of the battery is less than the predetermined voltage and more precisely sensing the voltage of the battery through the cut-off circuit unit when the voltage of the battery is equal to or greater than the predetermined voltage.

Hereinafter, a control method of the overvoltage protection circuit according to the embodiment of the present invention will be described.

FIG. 4 is a flowchart for describing a control method of the overvoltage protection circuit according to the embodiment of the present invention.

Referring to FIG. 4, in a control method of the overvoltage protection circuit according to the embodiment of the present invention, first, the voltage of the battery is measured (S110).

In addition, it is judged whether the battery voltage value measured in step S110 is equal to or greater than a first predetermined voltage value (S120).

As the judgment result of step S120, when the battery voltage value is equal to or greater than the first voltage value, power is supplied to the cut-off circuit unit (S130). In this case, steps S110 to S130 may be performed by the power circuit unit which is integrally formed. In this case, the power circuit unit may be connected between the battery and the cut-off circuit unit.

In addition, the cut-off circuit unit judges whether the battery voltage value is equal to or greater than a second predetermined voltage value (S140). Herein, the second voltage value may be a value which is equal to or greater than the first voltage value. In this case, the cut-off circuit unit may sense the battery voltage value based on the power supplied through step S130. In addition, the cut-off circuit unit may be configured to include a voltage comparator that compares the battery voltage value and the second voltage value.

As the judgment result of step S140, when the battery voltage value is equal to or greater than the second voltage value, the charge of the battery is cut off (S150). In this case, the cut-off circuit unit may cut off the charge of the battery based on the power supplied in step S130.

In addition, steps S140 and S150 are not performed when the battery voltage value is less than the first voltage value, but may be performed only at the time of the charge of the battery.

The control method of the overvoltage protection circuit according to the present invention is implemented in a form of a program command which may be performed through various computer means and may be recorded in the computer readable medium. The computer readable medium may include one or a combination of a program command, a data file, a data structure, and the like. The program command recorded in the medium may be specially designed and configured for the present invention, or may be publicly known to and used by those skilled in the computer software field. An example of the computer readable recording medium includes a magnetic media, such as a hard disk, a floppy disk, and a magnetic tape, optical medium such as a CD-ROM and a DVD, magneto-optical media such as a floptical disk, and all types of hardware devices such as a ROM, a RAM, and a flash memory, which are specially configured to store and execute the program command. An example of the program command includes a high-level language code executable by a computer by using an interpreter and the like, as well as a machine language code created by a compiler. The hardware devices may be configured to operate as one or more software modules in order to perform the operation of the present invention, and an opposite situation thereof is available.

The instructions of principles of the present invention may be implemented as a combination of hardware and software. Further, the software may be implemented as application programs which are actually implemented on a program storage unit. The application programs may be uploaded on a machine including any suitable architecture and executed by the machine. Preferably, the machine may be implemented on a computer platform having hardware such as one or more central processing units (CPUs), a computer processor, a random access memory (RAM), and I/O interfaces. Further, the computer platform may include an operating system and a microinstruction code. Various processes and functions described herein may be some of the microinstruction codes, some of application programs, or any combination thereof and executed by various processing devices including the CPU. Additionally, various other peripheral devices such as an additional data storage unit and a printer may be connected to the computer platform.

Since some of configuration system components and methods illustrated in the accompanying drawings are preferably implemented by software, it should be additionally understood that actual connections between the system components or the process function blocks may vary according to a method in which the principles of the present invention are programmed. When the instructions herein are given, those skilled in the art can consider these or similar implementations or configurations of the principles of the present invention.

As described above, the configurations and the methods of the embodiments described above may not be limitedly applied to the overvoltage protection circuit, the control method therefor, and the battery pack according to the present invention, but the embodiments may be configured by selectively combining all or some of the respective embodiments so as to be variously modified.

The invention claimed is:

1. An overvoltage protection circuit, comprising:
a voltage measurement unit for measuring the voltage of a battery;
a power control unit that supplies power if the battery voltage value measured in the voltage measurement unit is equal to or greater than a first predetermined voltage value; and
a cut-off circuit unit including a voltage comparator and a power disconnect device, wherein the cut-off circuit unit is configured to receive power supplied from the power control unit and to cut off the charge of the battery if the voltage value of the battery is equal to or greater than a second predetermined voltage value,
wherein the power disconnect device is configured to be directly connected between the battery and a charger, and
wherein the power disconnect device is a single switch in the over protection circuit.

2. The overvoltage protection circuit of claim 1, wherein the second voltage value is equal to or greater than the first voltage value.

3. The overvoltage protection circuit of claim 1, wherein the voltage measurement unit and the power control unit are configured by an integral power circuit unit.

4. The overvoltage protection circuit of claim 3, wherein the power circuit unit is connected between the battery and the cut-off circuit unit.

5. The overvoltage protection circuit of claim 1, wherein the voltage comparator judges whether the battery voltage value is equal to or greater than the second voltage value.

6. The overvoltage protection circuit of claim 1, wherein the cut-off circuit unit does not operate if the battery voltage value is less than the first voltage value, and
the cut-off circuit unit operates when the battery is charged.

7. A battery pack comprising:
a battery;
a charger;
a voltage measurement unit that measures the voltage of the battery;
a power control unit that supplies power if the battery voltage value measured in the voltage measurement unit is equal to or greater than a first predetermined voltage value; and
a cut-off circuit unit including a voltage comparator and a power disconnect device, wherein the cut-off circuit unit is configured to receive power supplied from the power control unit and to cut off the charge of the battery if the voltage value of the battery is equal to or greater than a second predetermined voltage value,
wherein the power disconnect device is connected between the battery and the charger, and
wherein the power disconnect device is a single switch in the overvoltage protection circuit.

8. The battery pack of claim 7, wherein the second voltage value is equal to or greater than the first voltage value.

9. The battery pack of claim 8, wherein the voltage measurement unit and the power control unit are configured by an integral power circuit unit.

10. The battery pack of claim 9, wherein the power circuit unit is connected between the battery and the cut-off circuit unit.

11. The battery pack of claim 7, wherein the voltage comparator judges whether the battery voltage value is equal to or greater than the second voltage value.

12. The battery pack of claim 7, wherein the cut-off circuit unit does not operate if the battery voltage value is less than the first voltage value.

13. The battery pack of claim 7, wherein the cut-off circuit unit operates when the battery is charged.

14. A control method of an overvoltage protection circuit, comprising:
measuring a voltage of a battery;
judging whether the battery voltage value measured in the measuring is equal to or greater than a first predetermined voltage value;
supplying power to a cut-off circuit unit when the battery voltage value is equal to or greater than the first voltage value;
judging whether the battery voltage value is equal to or greater than a second predetermined voltage value; and
cutting off the charge of the battery by the cut-off circuit unit if the battery voltage value is equal to or greater than the second voltage value,
wherein the cut-off circuit unit includes a voltage comparator and a power disconnect device,
wherein the power disconnect device is connected between the battery and a charger, and
wherein the power disconnect device is a single switch in the overvoltage protection circuit.

15. The method of claim 14, wherein the second voltage value is equal to or greater than the first voltage value.

16. The method of claim 14, wherein the measuring and the judging of whether the battery voltage value is equal to or greater than the first voltage value are performed by a power circuit unit which is integrally formed.

17. The method of claim 16, wherein the power circuit unit is connected between the battery and the cut-off circuit unit and performs the measuring and the judging of whether the battery voltage value is equal to or greater than the first voltage value.

18. The method of claim 17, wherein in the judging of whether the battery voltage value is equal to or greater than the second voltage value, the judging of whether the battery voltage value is equal to or greater than the second voltage value is performed by the voltage comparator.

19. The method of claim 14, wherein the judging of whether the battery voltage value is equal to or greater than the second voltage value and the cutting-off are not performed if the battery voltage value is less than the first voltage value.

20. The method of claim 14, wherein the judging of whether the battery voltage value is equal to or greater than the second voltage value and the cutting-off are performed when the battery is charged.

* * * * *